United States Patent
Xia et al.

(10) Patent No.: US 7,292,447 B2
(45) Date of Patent: Nov. 6, 2007

(54) BACK PLATE ASSEMBLY FOR A BOARD

(75) Inventors: Wan-Lin Xia, Shenzhen (CN); Tao Li, Shenzhen (CN); Jun Long, Shenzhen (CN)

(73) Assignees: Fu Zhun Precision Industry (Shen Zhen) Co. Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,411

(22) Filed: Mar. 22, 2006

(65) Prior Publication Data

US 2007/0223197 A1   Sep. 27, 2007

(51) Int. Cl.
*H05K 7/20* (2006.01)

(52) U.S. Cl. .............. 361/719; 361/702; 361/704; 361/816; 439/557; 165/80.3; 165/185; 24/453; 257/719; 257/E23.084; 257/E23.086; 174/51; 174/16.3; 174/368; 174/548; 411/503

(58) Field of Classification Search .......... 361/707, 361/709, 719, 688, 697, 736, 740, 816; 257/719, 257/E23.084; 174/7, 16.3, 368, 548; 24/453; 165/80.3, 185
See application file for complete search history.

(56) References Cited

U.S. PATENT DOCUMENTS

| | | | |
|---|---|---|---|
| 5,446,617 A * | 8/1995 | Blocher et al. ............. 361/674 |
| 5,901,039 A | 5/1999 | Dehaine et al. | |
| 6,307,748 B1 * | 10/2001 | Lin et al. .................. 361/704 |
| 6,400,577 B1 * | 6/2002 | Goodwin et al. .......... 361/816 |
| 6,475,030 B1 * | 11/2002 | Chang ....................... 439/557 |
| 6,480,387 B1 * | 11/2002 | Lee et al. .................. 361/704 |
| 6,480,388 B1 | 11/2002 | Lee et al. | |
| 6,611,431 B1 * | 8/2003 | Lee et al. .................. 361/719 |
| 6,654,254 B2 | 11/2003 | Szu et al. | |
| 6,697,256 B1 * | 2/2004 | Horng et al. .............. 361/704 |
| 6,859,367 B2 * | 2/2005 | Davison .................... 361/704 |
| 7,126,823 B2 * | 10/2006 | Chen et al. ................ 361/702 |
| 7,164,583 B2 * | 1/2007 | Lee et al. .................. 361/704 |
| 2005/0083661 A1 * | 4/2005 | Lee et al. .................. 361/719 |

* cited by examiner

*Primary Examiner*—Boris Chérvinsky
*Assistant Examiner*—Courtney Smith
(74) *Attorney, Agent, or Firm*—Jeffrey T. Knapp

(57) ABSTRACT

A back plate assembly (100) for a board (200) comprises a back plate (110) abutting against a side of the board and a plurality of posts (120). Each post comprises at least one latching portion (1206) formed thereon. After the latching portions have passed through the back plate and the board, the latching portions are blocked by one of the board and the back plate to secure the back plate to the board. Screws (330) are used to extend through a heat sink (300) to threadedly engage with the posts thereby mounting the heat sink to the board. Thus, the heat sink can have an intimate contact with an electronic component (210) mounted on the board.

12 Claims, 6 Drawing Sheets

BACK PLATE ASSEMBLY FOR A BOARD

FIELD OF THE INVENTION

The present invention relates to a back plate assembly, and more particularly to a back plate assembly which is pre-assembled to a printed circuit board (PCB) to facilitate mounting of components onto the PCB.

DESCRIPTION OF RELATED ART

Computer electronic such as the central processing units (CPUs) frequently generate large amounts of heat, which can destabilize operation and cause damage. A heat sink placed in thermal contact with an electronic device transfers heat from the electronic device through conduction, thus reducing the risk of such damage occurring. Nowadays, heat sinks are being made larger and larger, putting strain on the supporting PCB. Therefore, a back plate is often attached to an underside of a PCB such as a motherboard below an electronic device mounted on the motherboard. The back plate reinforces the motherboard and reduces the risk of deformation.

FIGS. 5-6 show a conventional back plate 1 for attachment to a motherboard 14, the motherboard 14 having a heat sink assembly 10 secured thereon. The back plate 1 comprises a base 2, and four U-shaped protrusions 3 extending from corners of the base 2. Each protrusion 3 defines a cutout 4 in an outmost extremity thereof. The motherboard 14 defines four through holes (not labeled). The heat sink assembly 10 comprises four hollow poles 12 extending from an underside thereof. In assembly, the heat sink assembly 10 is attached on the motherboard 14 with the poles 12 extending through the through holes of the motherboard 14. The back plate 1 is then attached to an underside of the motherboard 14, with the cutouts 4 of the back plate 1 in communication with the corresponding through holes of the motherboard 14. The poles 12 extend through the corresponding cutouts 4. Screws 16 are then extended through the corresponding cutouts 4 to engage in the hollow poles 12.

The back plate 1, the screws 16, the heat sink assembly 10 and the motherboard 14 are separated from each other before they are assembled together. None of them can be pre-assembled beforehand. This is disadvantageous in view of inventory management and transportation. Furthermore, the process of assembling the back plate 1, the screws 16, the heat sink assembly 10 and the motherboard 14 is time-consuming and inconvenient.

SUMMARY OF INVENTION

A back plate assembly for a board comprises a back plate abutting against a side of the board and a plurality of posts. Each post comprises at least one latching portion formed thereon. After the latching portions have passed through the back plate and the board, the latching portions are held by one of the board and the back plate to secure the back plate to the board.

Other advantages and novel features will become more apparent from the following detailed description of preferred embodiments when taken in conjunction with the accompanying drawings, in which:

DETAILED DESCRIPTION

Figure 1:
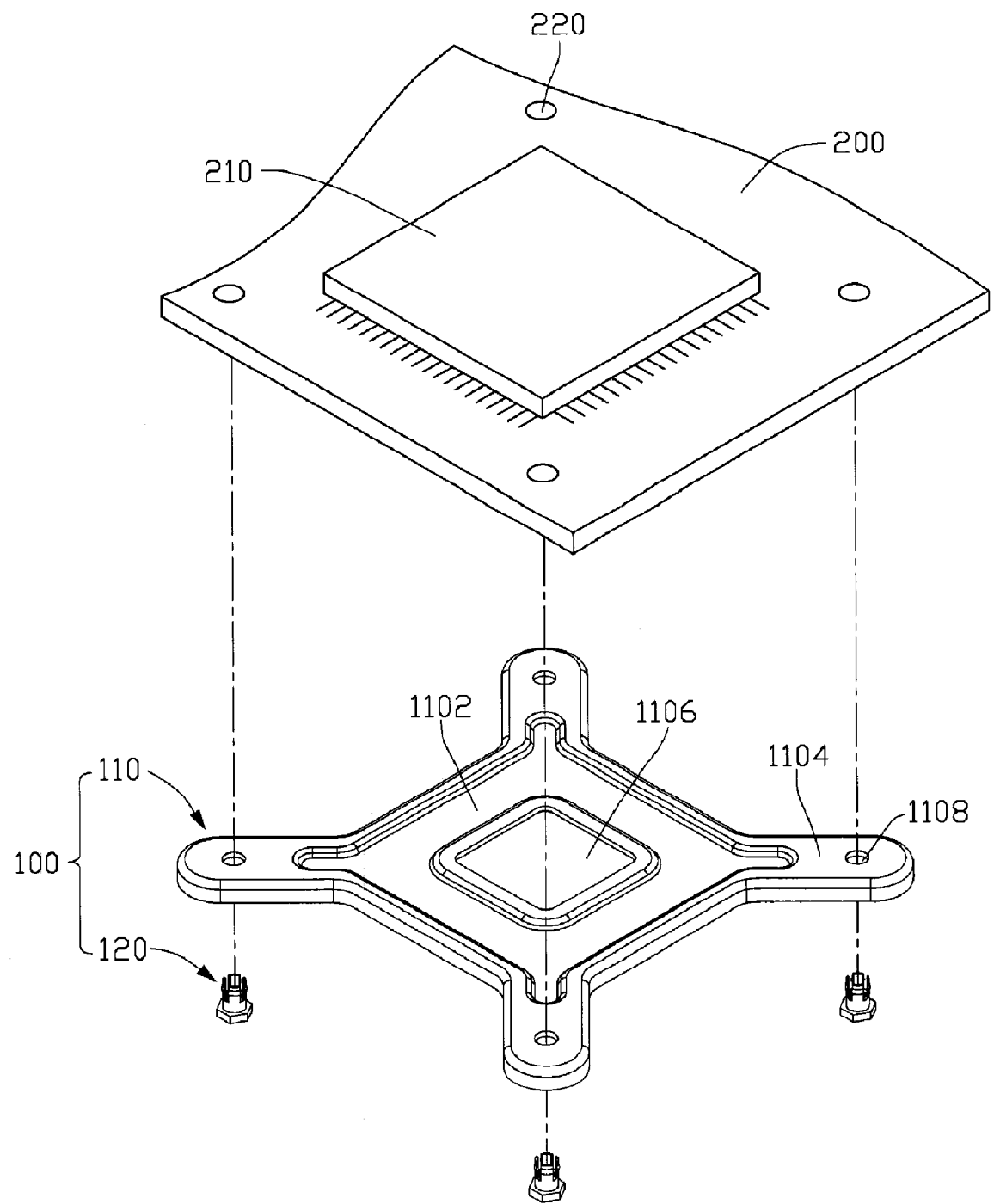
FIG. 1 is an exploded perspective view of a back plate assembly in accordance with a preferred embodiment of the present invention, together with a motherboard.

FIG. 1 shows a back plate assembly 100 in accordance with a preferred embodiment of the invention, together with a motherboard 200 and an electronic component such as a central processing unit (CPU) 210 mounted on an upper side of the motherboard 200. Four through apertures 220 are defined through the motherboard 200 and around the CPU 210. The placement of the apertures 220 on the motherboard 200 determines the position of the back plate assembly 100 relative to the motherboard 200.

The back plate assembly 100 is mounted on an underside of the motherboard 200 opposite to the CPU 210. The back plate assembly 100 comprises a cross-shaped back plate 110 and four hollow posts 120. The back plate 110 comprises a rectangular central portion 1102 and two pairs of fingers 1104. The fingers 1104 extend radially outwards from corresponding corners of the central portion 1102. A rectangular opening 1106 is defined through the central portion 1102, for improving elastic deformability of the back plate 110. A through hole 1108 is defined through an end portion of each finger 1104 for extension of a corresponding post 120 therein.

Figure 2:
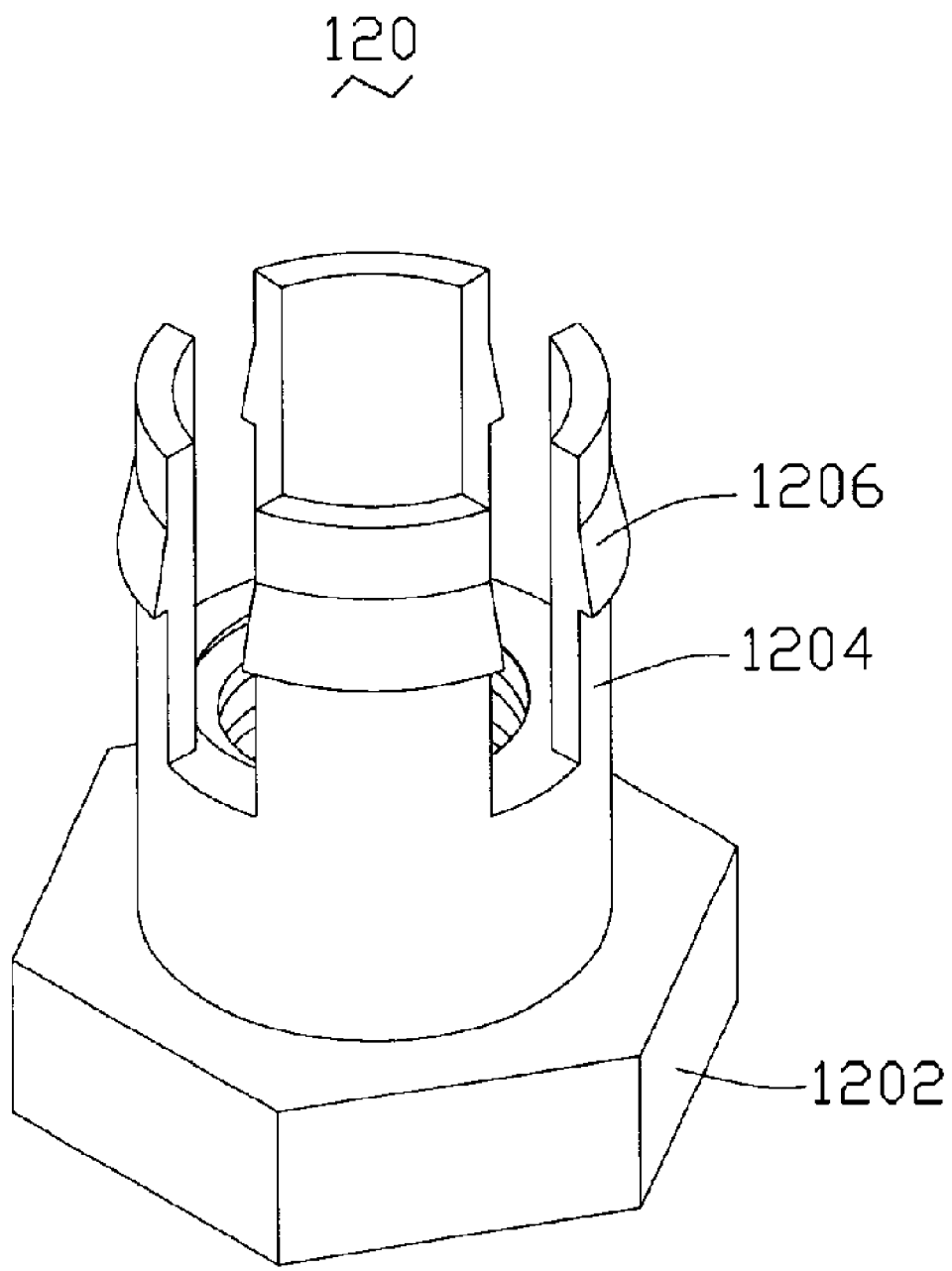
FIG. 2 is an enlarged view of a post of the back plate assembly of FIG. 1.

Referring also to FIG. 2, each post 120 has a circular-shaped cross-section, and comprises a bottom end 1202 which forms a hexagonal flange serving as a stop against a bottom side of the back plate 110. Four resiliently deformable portions 1204 extend upward and symmetrically at a top end of the post 120. Each deformable portion 1204 comprises a slanted latching portion 1206 on an outer surface thereof. Furthermore, an inner hole (not labeled) of each post 120 is threaded for engaging with a corresponding screw. The inner hole extends through the post 120.

Figure 3:
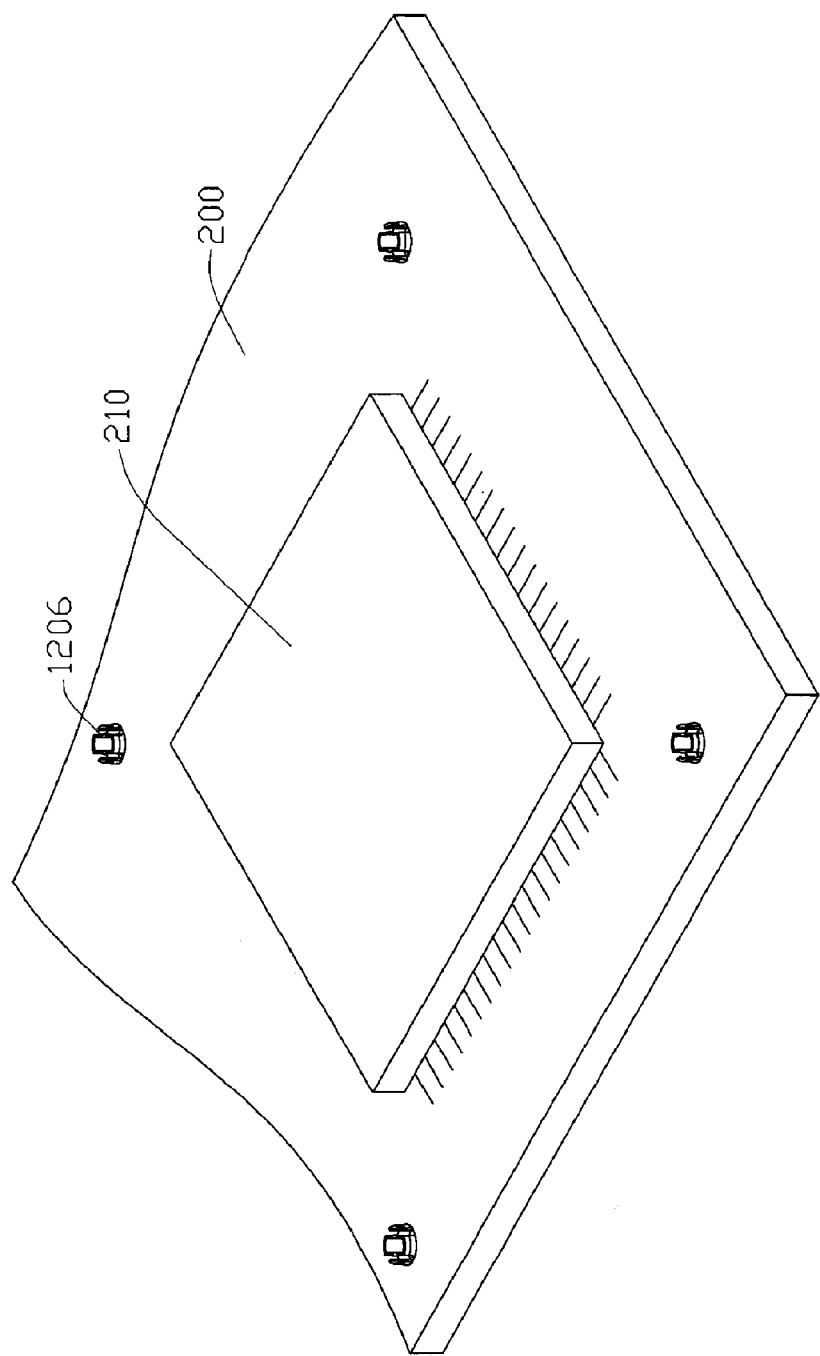
FIG. 3 is an assembled view of FIG. 1.

Referring also to FIG. 3, in assembly, the back plate 110 is attached to the underside of the motherboard 200, and the rectangular central portion 1102 of the back plate 110 abuts against the motherboard 200. The resiliently deformable portions 1204 of each post 120 are pressed to deform so as to cause the latching portions 1206 thereof to extend through the corresponding through holes 1108 of the back plate 110, and then through apertures 220 of the motherboard 200 in turn. Then, the resiliently deformable portions 1204 reinstate their natural state to cause the latching portions 1206 to engage with an edge of the corresponding aperture 220 of the motherboard 200. The back plate 110 is thus securely attached to the motherboard 200.

Figure 4:
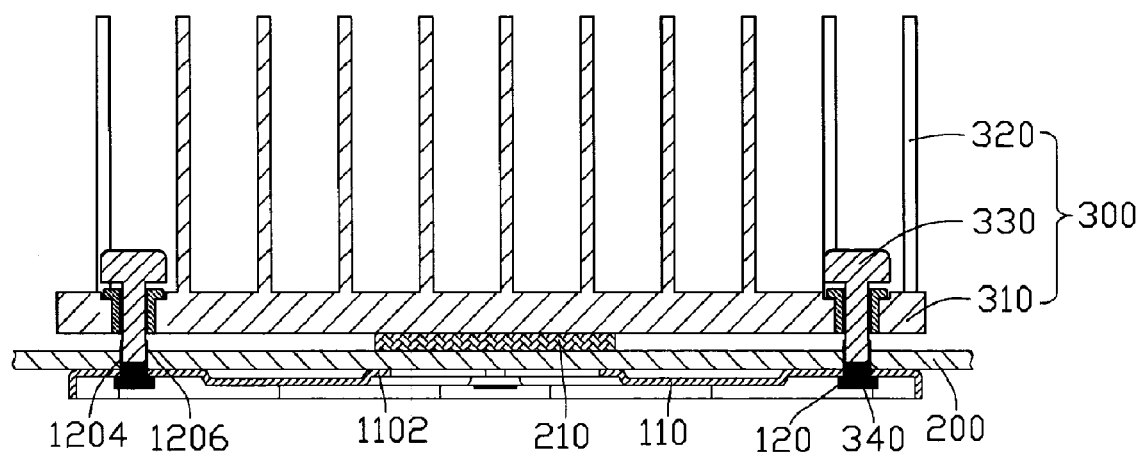
FIG. 4 is a schematic cutaway view of the back plate assembly of FIG. 1 mounting a heat sink to the motherboard.
Figure 5:
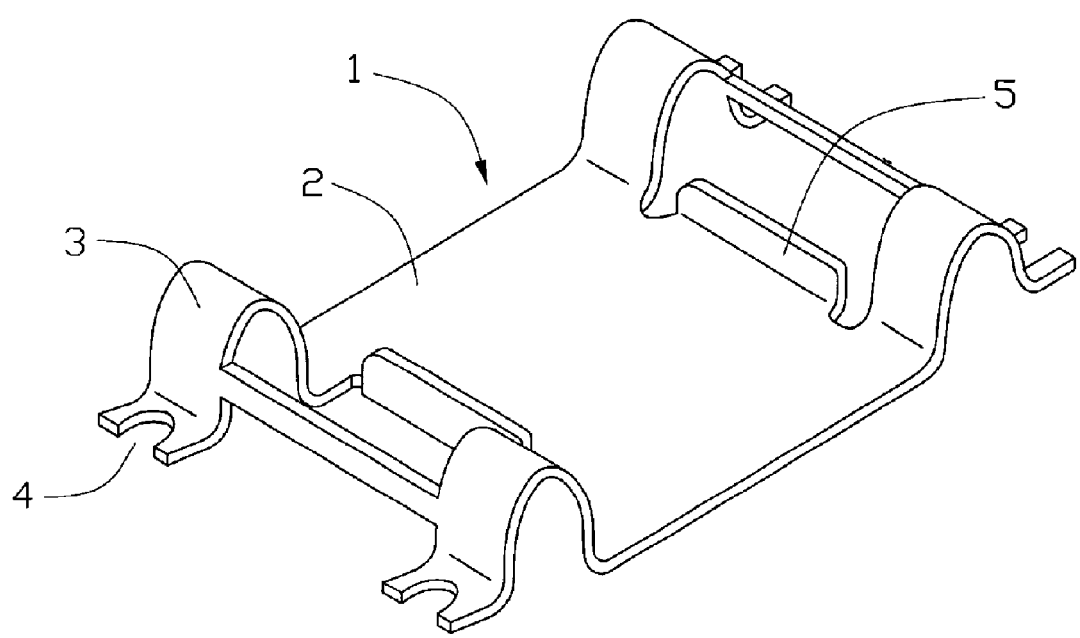
FIG. 5 is a perspective view of a conventional back plate.
Figure 6:
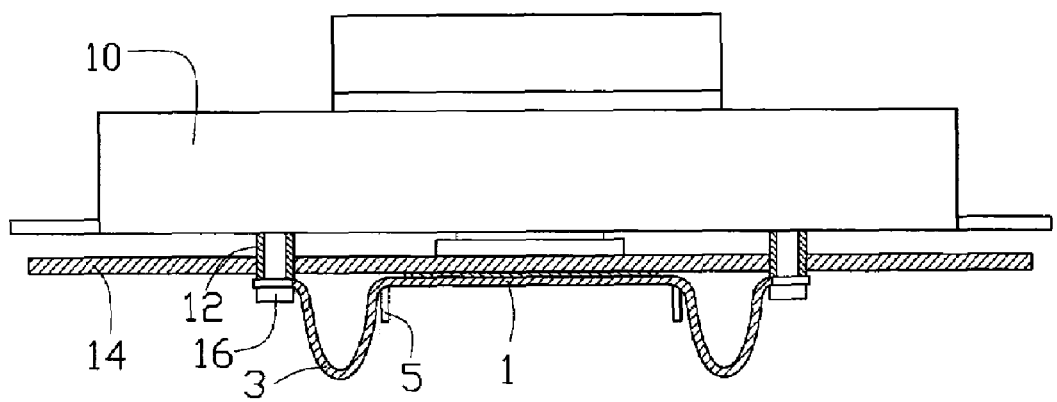
FIG. 6 is a schematic cross-sectional view of the back plate of FIG. 5 securing a heat sink to a motherboard.

In addition to reinforcing and strengthening the motherboard 200, the back plate assembly 100 can also mount a heat sink 300 onto the motherboard 200 to cool the CPU 210. Referring also to FIG. 4, the heat sink 300 comprises a base 310 facing the CPU 210, a plurality of fins 320 mounted on the base 310, and four screws 330 with threaded portions 340, which have passed through the base 310. FIG. 4 illustrates a stage in the process for mounting the heat sink 300 onto the motherboard 200. In this stage, the thread portions 340 of the screws 330 have been screwed into the posts 120; in this way, the heat sink 300 is securely mounted onto the motherboard 200 and has an intimate contact with the CPU 210.

As described above, the back plate assembly 100 and the motherboard 200 are assembled together prior to the heat sink 300 being mounted onto the motherboard 200. This is advantageous in view of inventory management and transportation of the back plate assembly 100 and the motherboard 200. Since the back plate assembly 100 can be pre-assembled to the motherboard 200, the heat sink 300 can be secured to the motherboard 200 so long as the screws 330 are brought to extend through the heat sink 300 and threadedly engage in the posts 120. The present invention dramatically simplifies the assembly process of fixing the heat sink 300 to the motherboard 200. Therefore, particularly in mass-production facilities, the assembly process is timesaving and convenient.

In the preferred embodiment, the latching portions 1206 of the posts 120 are pushed to extend through the through holes 1108 of the back plate 110 and the through apertures 220 of the motherboard 200 in turn; then, the latching portions 1206 engage with the edges of the apertures 220 of the motherboard 220. Or, conversely, the latching portion 1206 of the posts 120 may be pushed to extend through the through apertures 220 of the motherboard 200 and the through holes 1108 of the back plate 110 in turn, then the latching portions 1206 engage with the edges of the through holes 1108 of the back plate 110. This can also secure the back plate 110 to the motherboard 200 in a similar fashion to that of the preferred embodiment.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A back plate assembly for a board, comprising:
   a back plate abutting against an underside of the board; and
   a plurality of posts, each comprising at least one latching portion formed on a top end thereof, wherein after the latching portions have passed through the back plate and the board, the latching portions clasp one of the board and the back plate so as to secure the back plate to the board;
   wherein each post comprises a flange formed at a bottom end thereof, and the flange serves as a stop against the other one of the back plate and the board to cause the back plate and the board to be sandwiched by the latching portions and the flange; and
   wherein each post further comprises at least one resiliently deformable portion extending at the top end thereof, and the latching portion is located at an edge of the resiliently deformable portion, wherein at least each post or each fastener corresponding to the post is threaded.

2. The back plate assembly as claimed in claim 1, wherein each post is hollow, and an inner hole of each post is threaded for engaging with another component.

3. The back plate assembly as claimed in claim 1, wherein the back plate comprises a central portion abutting against the underside of the board and a plurality of fingers extending from corners of the central portion.

4. The back plate assembly as claimed in claim 3, wherein an opening is defined through the central portion.

5. The back plate assembly as claimed in claim 3, wherein a through hole is defined through each finger for extension of a corresponding post therein.

6. An electronic device assembly comprising:
   a printed circuit board with an electronic device mounted thereon, the printed circuit board defining a plurality of through apertures;
   a heat sink mounted on the printed circuit board to cool the electronic device; and
   a back plate assembly for attaching the heat sink to the printed circuit board, the back plate assembly comprising:
   a back plate attached to a side of the printed circuit board opposite to the electronic device, the back plate defining a plurality of through holes in communication with the through apertures of the printed circuit board;
   a plurality of posts, each comprising at least one deformable latching portion formed on a top end thereof; and
   a plurality of fasteners extending through the heat sink and engaging with the posts to mount the heat sink onto the printed circuit board; wherein at least each post or each corresponding fastener is threaded;
   wherein the latching portions extend through the back plate and the board, then are blocked by one of the board and the back plate to secure the back plate to the board, prior to the heat sink being mounted onto the printed circuit board.

7. The electronic device assembly as claimed in claim 6, wherein each post further comprises a flange formed at a bottom end thereof, wherein the flange is blocked by the other one of the back plate and the board.

8. The electronic device assembly as claimed in claim 7, wherein each post is hollow, and an inner hole of each post is threaded for engaging with a corresponding fastener.

9. The electronic device assembly as claimed in claim 8, wherein each fastener comprises a screw with a treaded portion threadedly engaging with a corresponding post.

10. An electronic device assembly comprising:
    a printed circuit board having a top surface mounted with an electronic component thereon and a bottom surface;
    a back plate attached to the bottom surface of the printed circuit board;
    a plurality of posts extending through the back plate and the printed circuit board and engaging with the back plate and the printed circuit board to produce a first force to connect the back plate and the printed circuit board together;
    a heat sink mounted on the top surface of the printed circuit board and contacting with the electronic component; and
    a plurality of screws extending through the heat sink to threadedly engage in the posts to produce a second force to fasten the heat sink to the printed circuit board;
    wherein the first force is independent from the second force.

11. The electronic device assembly as claimed in claim 10, wherein each of the posts has a lower flange abutting against a bottom surface of the back plate and an upper deformable portion forming a latch on an outer surface thereof, the latch engaging the top surface of the printed circuit board.

12. The electronic device assembly as claimed in claim 11, wherein each of the posts defines an inner hole extending therethrough, the inner hole being threaded to threadedly engage with a corresponding screw.

* * * * *